US008222652B2

(12) United States Patent
Harrah et al.

(10) Patent No.: US 8,222,652 B2
(45) Date of Patent: Jul. 17, 2012

(54) METHOD FOR CONTROLLING COLOR ACCURACY IN A LIGHT-EMITTING SEMICONDUCTOR-BASED DEVICE AND PROCESS FOR PRODUCING A LIGHT-EMITTING SEMICONDUCTOR-BASED DEVICE WITH CONTROLLED COLOR ACCURACY

(75) Inventors: Shane Harrah, Livermore, CA (US); David Hum, Livermore, CA (US)

(73) Assignee: Bridgelux, Inc., Livermore, CA (US)

( * ) Notice: Subject to any disclaimer, the term of this patent is extended or adjusted under 35 U.S.C. 154(b) by 154 days.

(21) Appl. No.: 12/763,906

(22) Filed: Apr. 20, 2010

(65) Prior Publication Data

US 2011/0254027 A1 Oct. 20, 2011

(51) Int. Cl.
*H01L 33/00* (2010.01)
*F21V 9/00* (2006.01)

(52) U.S. Cl. .................. 257/89; 257/E33.055; 362/231

(58) Field of Classification Search .................. 257/79, 257/99, 89, E33.055; 362/227, 231, 294, 362/276; 315/312
See application file for complete search history.

(56) References Cited

U.S. PATENT DOCUMENTS

| | | | |
|---|---|---|---|
| 6,234,645 B1 | 5/2001 | Borner et al. | |
| 6,513,949 B1 | 2/2003 | Marshall et al. | |
| 6,636,003 B2 | 10/2003 | Rahm et al. | |
| 7,014,336 B1 | 3/2006 | Ducharme et al. | |
| 7,213,940 B1 | 5/2007 | Van De Ven et al. | |
| 2004/0264193 A1* | 12/2004 | Okumura | 362/276 |
| 2006/0027781 A1* | 2/2006 | Dong et al. | 252/62.52 |
| 2007/0114562 A1* | 5/2007 | Radkov et al. | 257/103 |
| 2008/0007509 A1* | 1/2008 | Lankhorst et al. | 345/102 |
| 2008/0238335 A1* | 10/2008 | Lee et al. | 315/294 |

OTHER PUBLICATIONS

U.S. Appl. No. 12/323,924—Method and Apparatus for Providing LED Package With Controlled Color Temperature Inventor: Rene Helbing, filed Nov. 26, 2008.
U.S. Appl. No. 12/343,080—Performance and Color Consistent LED Inventor: Jason Posselt, filed Dec. 23, 2008.
U.S. Appl. No. 12/763,906—Method for Controlling Color Accuracy in a Light-Emitting Semiconductor-Based Device... Inventor: Shane Harrah, filed Apr. 20, 2010.
U.S. Appl. No. 12/815,327—LED Array With Improved Color and Flux Consistency Inventor: David Hum, filed Jun. 14, 2010.
U.S. Appl. No. 12/836,140—LED Array Package With a Color Filter Inventor: Suning Xie, filed Jul. 14, 2010.
U.S. Appl. No. 12/856,293—Color Temperature Tunable Light Source Inventor: Ghulam Hasnain, filed Aug. 13, 2010.
U.S. Appl. No. 12/856,009—Drive Circuit for a Color Temperature Tunable Light Source Inventor: Ghulam Hasnain, filed Aug. 13, 2010.

* cited by examiner

*Primary Examiner* — A. Sefer
*Assistant Examiner* — Nikolay Yushin
(74) *Attorney, Agent, or Firm* — Pavel Kalousek

(57) ABSTRACT

A method for controlling color accuracy of a light-emitting semiconductor-based device, and a process for producing a light-emitting semiconductor-based device with desired color accuracy is disclosed. The color accuracy is controlled by defining a desired color accuracy of a light produced by mixing colors emitted by at least two light sources over a first range of operating conditions; determining characteristics of the light as a function of operating conditions; and establishing desired light characteristics of the at least two light sources over a second range of operating condition in accordance with the step of defining and the step of determining.

19 Claims, 5 Drawing Sheets

METHOD FOR CONTROLLING COLOR ACCURACY IN A LIGHT-EMITTING SEMICONDUCTOR-BASED DEVICE AND PROCESS FOR PRODUCING A LIGHT-EMITTING SEMICONDUCTOR-BASED DEVICE WITH CONTROLLED COLOR ACCURACY

BACKGROUND

1. Field

The present disclosure relates to a light-emitting device, and more particularly, to a method and an apparatus for controlling color accuracy of the light-emitting semiconductor-based device within a range of operating conditions.

2. Description of Related Technology

A person skilled in the art will appreciate that the concepts disclosed in this application are applicable to packages for semiconductor-based light-emitting devices, namely a light-emitting diode (LED) device.

To better understand the concepts underlying both the related technology and the detailed description of various aspects of this disclosure, a brief introduction into human light and color perception and one of its scientific representations is provided. The representation well suited for the purposes of this disclosure is a Commission International de l'Eclairage (CIE) chromaticity diagram.

In this disclosure the term light has an ordinary meaning, i.e., an electromagnetic radiation, particularly radiation of a wavelength that is visible to the human eye, i.e., (about 400-700 nm, or perhaps 380-750 nm). Similarly, the term color has an ordinary meaning, i.e., a property of light as perceived by a human eye. A person skilled in the art will appreciate that the meaning of the two terms may overlap, e.g., the construct "a light source" and "color source" can be both interpreted as a source of electromagnetic radiation with a wavelength visible to human eye. Should a distinction between these terms be important, the distinction is emphasized in the disclosure.

A connection between human color perception and the CIE chromaticity diagram can be explained by use of tristimulus values. The human eye has photoreceptors, called cone cells, for medium- and high-brightness color vision, with sensitivity peaks in short (S, 420-440 nm), middle (M, 530-540 nm), and long (L, 560-580 nm) wavelengths. Thus, in principle, three parameters, i.e., the tristimulus values, describe a color sensation. The tristimulus values of a color are the amounts of three primary colors in a three-component additive color model and, are most often represented in a CIE 1931 color space, in which they are denoted X, Y, and Z. However, the concept of color can be divided into two parts: brightness (luminance) and chromaticity. For example, the color white is a bright color, while the color gray is considered to be a less bright version of that same white. In other words, the chromaticity of white and gray are the same while their brightness differs. The CIE XYZ color space was deliberately designed so that the Y parameter was a measure of the brightness or luminance of a color. The chromaticity of a color was then specified by two derived parameters x and y, two of the three normalized values which are functions of all three tristimulus values X, Y, and Z.

The CIE chromaticity diagram is thus a two-dimensional representation of the three-dimensional CIE color space, which maps human color perception in terms of the two CIE parameters x and y. Because the normalization has been carried out by further imposing the condition:

$$x+y+z=1 \qquad (1)$$

all three normalized values can be unambiguously derived from the CIE chromaticity diagram once a luminance is specified. For further technical description of the CIE chromaticity diagram, see, e.g., "Encyclopedia of Physical Science and Technology", vol. 7, 230-231 (Robert A Meyers ed., 1987).

FIG. 1 depicts a gamut of human eye visible light spectrum, i.e., all of the visible chromaticities on the CIE chromaticity diagram. The horseshoe shape curve 102 represents spectral (also known as monochromatic) colors, all the remaining colors are not spectral: the bottom straight line 104 connecting the ends of the diagram, thus connecting the two ends of the visible spectrum, is the line of purples, corresponding to the color purple, made up of the two spectral colors—blue (420 nm) and red (680 nm); the interior 106 represents unsaturated colors, i.e., a mixture of a spectral color and a grayscale color.

A classical definition of white light is that of an electromagnetic radiation composed of a distribution of frequencies in the visible range of the spectrum, appearing white to the eye. As such, it is a portion of the unsaturated color region, in particular the line 108. Line 108 called Planckian locus, is the path that the color of a black body takes as the black body temperature changes. The different temperatures are depicted as lines 110 called correlated color temperatures (CCT), i.e., the temperature of the Planckian radiator whose perceived color most closely resembles that of a given stimulus at the same brightness and under specified viewing conditions.

A color near to this locus—a nearly-Planckian white—is characterized by a deviation from the coordinates lying on the Planckian locus 108 and is perceived as a slight coloration called a tint. Thus the distinction between "white" color and other unsaturated colors can be described by specifying the maximum tint permitting the designation "white." Thus, tint describes degree of departure from a black body concept, and is often prescribed by a standard. By means of an example, the automobile industries standard SAE J578 prescribes the maximum tint permitting the designation "white"; the CIE defines white light as a color point located less than 0.05 in chromatic distance to either the Planckian locus for CCTs <5000K and the standard illuminant locus for CCTs >5000K. Thus the CCT concept is useful in characterizing nearly-Planckian white light sources; such sources are judged by their CCT, i.e., the color temperature of the Planckian radiator that best approximates the nearly-Planckian light sources.

LEDs have been used for many years in various light requiring applications, e.g., signaling states for devices, i.e., light on or off, opto-couplers, displays, replacement of bulbs in flashlights, and other applications known in the art. Consequently, LEDs emitting both spectral colors and white light have been developed. Due to LEDs' advantages, i.e., light weight, low energy consumption, good electrical power to light conversion efficiency, an increased interest has been recently focused on use of LEDs even for high light intensity application, e.g., replacement of conventional, i.e., incandescent and fluorescent, light sources, traffic signals, signage, and other high light intensity applications known to a person skilled in the art. It is customary for the technical literature to use the term "high power LED" to imply high light intensity LED; consequently, such terminology is adopted in this disclosure, unless noted otherwise.

In high power LEDs applications, such as architectural lighting, color is the most important electronic design consideration. Architectural lighting further desires that the applicable LED emit light with particular requirements regarding the color, e.g., white light. Based on the foregoing discussion, the white light color accuracy may be described by desired CCT and maximal deviation thereof, and maximal allowable deviation from Planckian locus. Such requirement is equivalent to defining a point in the CIE chromaticity diagram. Referring to FIG. 2, such a point is referenced as 210. The description of like elements between FIG. 1 and FIG. 2 is not repeated, the like elements have reference numerals differing by 100, i.e., reference numeral 102 in FIG. 1 becomes reference numeral 202 in FIG. 2.

There are two primary approaches to producing white light using LEDs. One is to use individual LED dice that emit the three primary colors—red, green, and blue, and then mix the colors to produce white light. For the purposes of this disclosure a die has its common meaning of a light-emitting semiconductor chip comprising a p-n junction. The other approach is to use a phosphor material to convert monochromatic light from a blue or ultra-violet color emitting LED die or dice to a broad-spectrum white light, much in the same way a fluorescent light bulb works. Regardless of the approach selected, the required white light, represented by chromaticity 210, is achieved by mixing colors from different sources, i.e., the individual LED dice or LED die or dice and phosphors.

One of the properties of the CIE chromaticity diagram is a convenient representation of mixtures of two light sources. Under the laws of color mixture that underlie this system, the chromaticities of all mixtures of any two light sources lie on a straight line connecting the chromaticities of the two light sources. Varying the luminosity of each light source, in other words, varying the ratio of the luminosities varies a particular light defined by a position of a point on the line. By extension, all colors that can be formed by mixing three light sources are found inside the triangle formed by the light sources' points on the chromaticity diagram, and so on for multiple light sources.

Thus, applying the above principle to the three sources of color 212, 214, and 216, the point 210 must lie within the triangle whose vertices are defined by the three sources of color 212, 214, and 216. Consequently, by selecting proper characteristics of the color sources, i.e., position in the CIE chromaticity diagram and luminosity, the required color 210 can be generated.

Application of the concept into practical applications allows for determination of changes in characteristics of the mixed color due to changes in operating condition of the light-emitting device. Although any change in operating conditions is contemplated, in comparison to other light sources, light-emitting diodes generate a significant amount of heat. As a consequence, the operating temperature of the light-emitting device changes due to this internal heating, as well as by any change of the surrounding environment temperature. As the temperature of the light-emitting device increases, the characteristics of each LED changes, e.g., for most blue LEDs, the dominant wavelength increases and the luminous flux decreases. Such a change in the characteristics of each LED results in a change of characteristics of the emitted light as represented, e.g., on the CIE chromaticity diagram. Thus, the change in dominant wavelength is represented by shift in the position of the color source in the CIE chromaticity diagram, e.g., former colors 212, 214, and 216 shift to colors 212s, 214s, and 216s; the change in luminous flux is represented by shift in the mixed color 210s generated by the light-emitting device.

A person skilled in the art will appreciate that although the description above implies LED sources, the mechanism is source agnostic because different phosphor characteristics, e.g., quantum efficiency, emission spectrum, and absorptivity, are functions of the operating conditions, among them temperature. Consequently, change in quantum efficiencies of the different phosphors and the blue or ultra violet color emitting LED die or dice relative to one another results in changes in the emitted light characteristics. Furthermore, to achieve design goals in high power light-emitting devices a combination of LED light sources of different colors combined with phosphors light sources is often used.

By means of an example of such a high power light-emitting device, consider an array of LED dice emitting blue or ultra-violet light, e.g., InGaN dice, encapsulated within a mixture of transparent encapsulant, typically silicone-based, and one or more phosphors, which emit green, red, and/or yellow light upon absorption of the blue or ultra-violet light. However, a conversion efficiency of the red phosphors is lower relatively to the green phosphors. Furthermore, Stokes shift losses are inherent to red phosphors. The luminous efficacy of the red color produced by converting the LED emitted blue or ultra-violet color by the red phosphors is given by the luminous efficacy of the LED emitted blue or ultra-violet color multiplied by the Stokes shift of the red phosphors. Consequently, the Stokes shift losses may negatively affect the luminous efficacy of the red color produced by converting the LED emitted blue or ultra-violet color by the red phosphors. Additionally, red phosphors contain most of the spectral power at shorter wavelengths, i.e., in the near-infrared part of the spectrum. Based on design criteria for the color accuracy, these effects result in limitation on the luminous efficacy of the white light emitted by the light-emitting device.

One configuration solving the above-described limitation on the luminous efficacy is to add one or more red color emitting LED die, e.g., AlInGaP die, to the array of LED dice emitting blue or ultra-violet light. The red color emitting LED die or dice are spectrally narrow compared to red phosphors. Consequently, the red color emitting LED die or dice are spectrally more luminous than the red phosphors; specifically at long wavelengths. Additionally, red color emitting LED die or dice do not exhibit Stokes shift losses inherent to red phosphors. Consequently, for certain design criteria, the added red color emitting LED die or dice compensates for the lower luminous efficacy of the red light produced by converting the LED emitted blue or ultra-violet color by the red phosphors. In an alternative configuration, the red phosphor may be omitted because the efficiency of the red color emitting LED die or dice is sufficient by itself.

In accordance with the above-described principles, such a light-emitting device will exhibit changes in the color accuracy of the emitted light as a function of operating conditions, e.g., temperature.

Although the state of related technology was described in terms of a particular example—a light-emitting device producing a white light, a person skilled in the art will appreciate that such was done for familiarity with the particular example. Consequently, the desired color accuracy is not to be limited by terms CCT and deviation from Planckian locus, associated with white light; after all, as discussed above, these terms describe any area in the CIE chromaticity diagram; therefore, any light.

Accordingly, there is a need in the art for improvements in controlling color accuracy of a light-emitting device comprising at least two light sources within a range of operating conditions, as well as additional advantages evident to a person skilled in the art.

SUMMARY

In one aspect of the disclosure, a method and an apparatus for controlling color accuracy in a light-emitting device according to appended independent claims is disclosed. Preferred additional aspects are disclosed in the dependent claims.

BRIEF DESCRIPTION OF THE DRAWINGS

The foregoing aspects described herein will become more readily apparent by reference to the following description when taken in conjunction with the accompanying drawings wherein.

DETAILED DESCRIPTION

Figure 1:
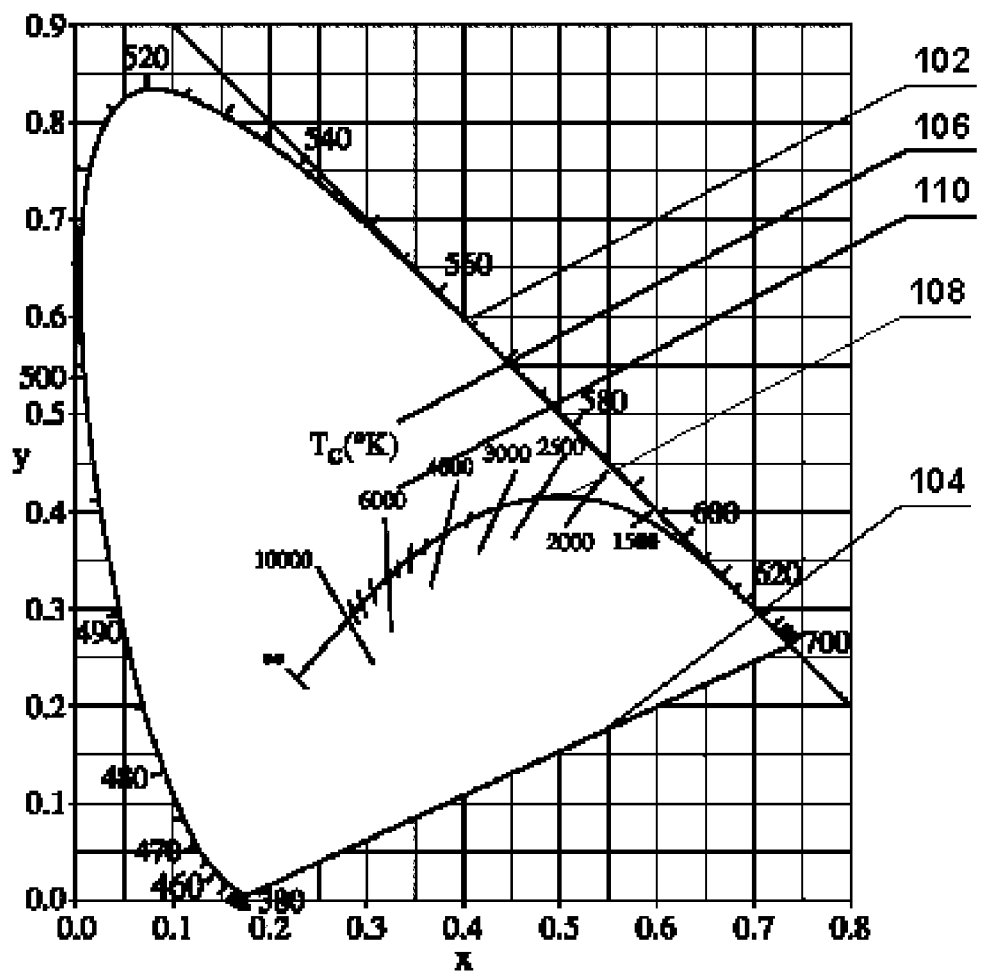
FIG. 1 depicts a gamut of human eye visible light spectrum in a CIE chromaticity diagram.
Figure 2:
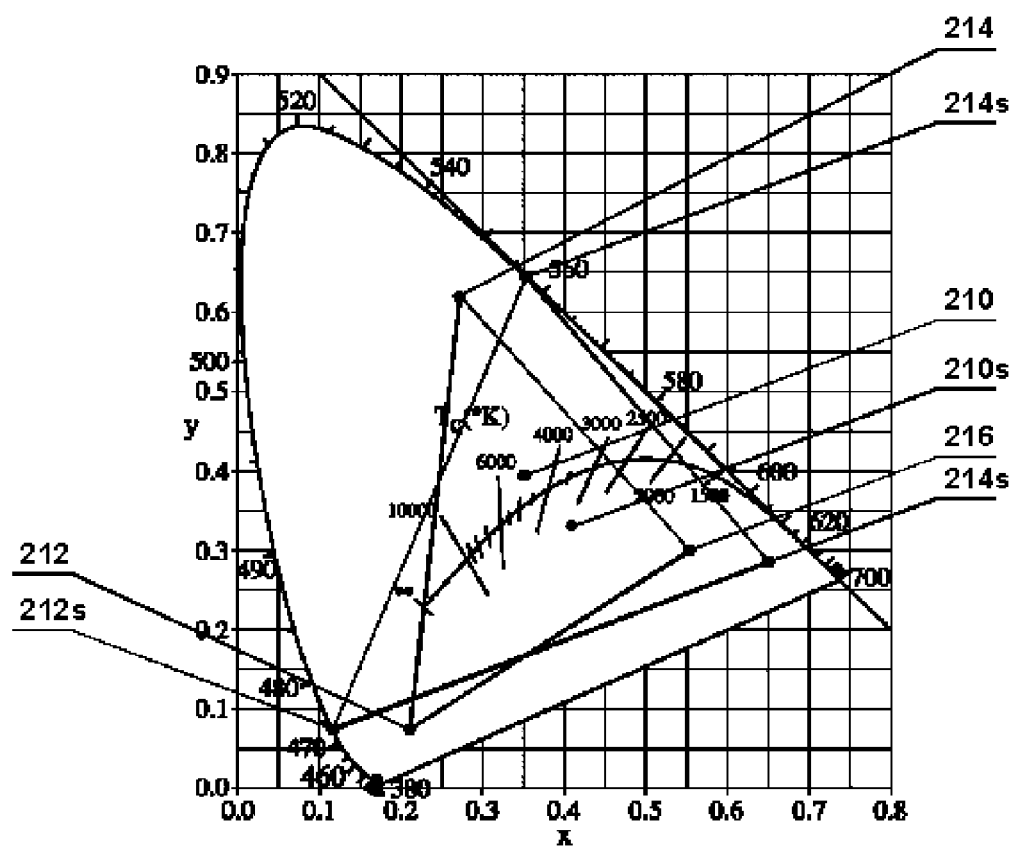
FIG. 2 depicts a gamut of colors in a CIE chromaticity diagram delimited by a plurality of sources.

Various aspects of the present invention will be described herein with reference to drawings that are schematic illustrations of idealized configurations of the present invention. As such, variations from the shapes of the illustrations as a result, for example, manufacturing techniques and/or tolerances, are to be expected. Thus, the various aspects of the present invention presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present invention.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Furthermore, relative terms, such as "lower" or "bottom" and "upper" or "top," may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements disclosed as being on the "lower" side of other elements would then be oriented on the "upper" side of the other elements. The term "lower" can therefore encompass both an orientation of "lower" and "upper," depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Various disclosed aspects may be illustrated with reference to one or more exemplary configurations. As used herein, the term "exemplary" means "serving as an example, instance, or illustration," and should not necessarily be construed as preferred or advantageous over other configurations disclosed herein.

Furthermore, various descriptive terms used herein, such as "on" and "transparent," should be given the broadest meaning possible within the context of the present disclosure. For example, when a layer is said to be "on" another layer, it should be understood that that one layer may be deposited, etched, attached, or otherwise prepared or fabricated directly or indirectly above or below that other layer. In addition, something that is described as being "transparent" should be understood as having a property allowing no significant obstruction or absorption of electromagnetic radiation in the particular wavelength (or wavelengths) of interest, unless a particular transmittance is provided.

As discussed in the Description of Related Technology section, change in operating conditions, especially temperature dependency, of light-emitting die or dice and phosphor parameters, is a significant concern for manufacturing LED-based light-emitting devices. Fortunately, most lighting products are targeted for specific applications. As a result, the typical operating temperature range for the product is known. As a means of an example, many indoor lighting products operate in rooms with 20 C-25 C air temperature. In contrast, many outdoor lighting products operate exclusively at night, when air temperatures are cooler, typically 0 C-20 C, depending on season and geographical location. Consequently, the product can be designed to a specific accuracy, i.e., deviation of the color emitted by the product from the desired color over the given temperature range. The deviation is described in terms of maximal range of CCT and maximal deviation form Planckian locus, or more generally by maximal deviation in x and y coordinates in the CIE chromaticity diagram.

A person skilled in the art will appreciate that temperature is an example of one operating condition affecting the color accuracy of a light-emitting device. Consequently, the disclosed aspects are equally applicable to a change in any one of the operating conditions.

In one aspect of the disclosure a combination of phosphor and LED is found that does not change light characteristics—or changes light characteristics negligibly—over the range of operating conditions.

In accordance with a different aspect of the disclosure, it is accepted that the different color sources change their characteristics, and the change in the characteristics translates into change of the emitted light characteristics, due to change in operating conditions, and the manufacturing process is designed to compensate for the change.

To continue with the example, in which such operating condition is temperature, an exemplary LED color source will change characteristics, e.g., luminous flux, dominant wavelength, color rendering index, forward voltage, and other characteristics with a change in the temperature. This in turn results in a change in the emitted light characteristics. Similarly, an exemplary phosphor color source will change characteristics, e.g., quantum efficiency, emission spectrum, and absorptivity, and the change in the characteristics translates to a change in the emitted light characteristics.

To design a manufacturing process able to compensate for the change in operating conditions, it is necessary to select a combination of color sources that have reproducible change in light characteristics due to the change in operating conditions. An example of combinations not satisfying reproducible change would comprise certain single crystal phosphors that may not have reproducible changes depending on the starting wavelength of the blue or ultra-violet light emitting LED. As an example, if a light-emitting device comprises a phosphor with an excitation spectrum sharply peaked at 460 nm and such a phosphor is illuminated by blue LEDs with different wavelengths, consider, e.g., two LEDs one with wavelength 459 nm and the second with a wavelength 461 nm, the color shift of these two white light producing light-emitting devices would be different with increasing temperature.

Figure 3:
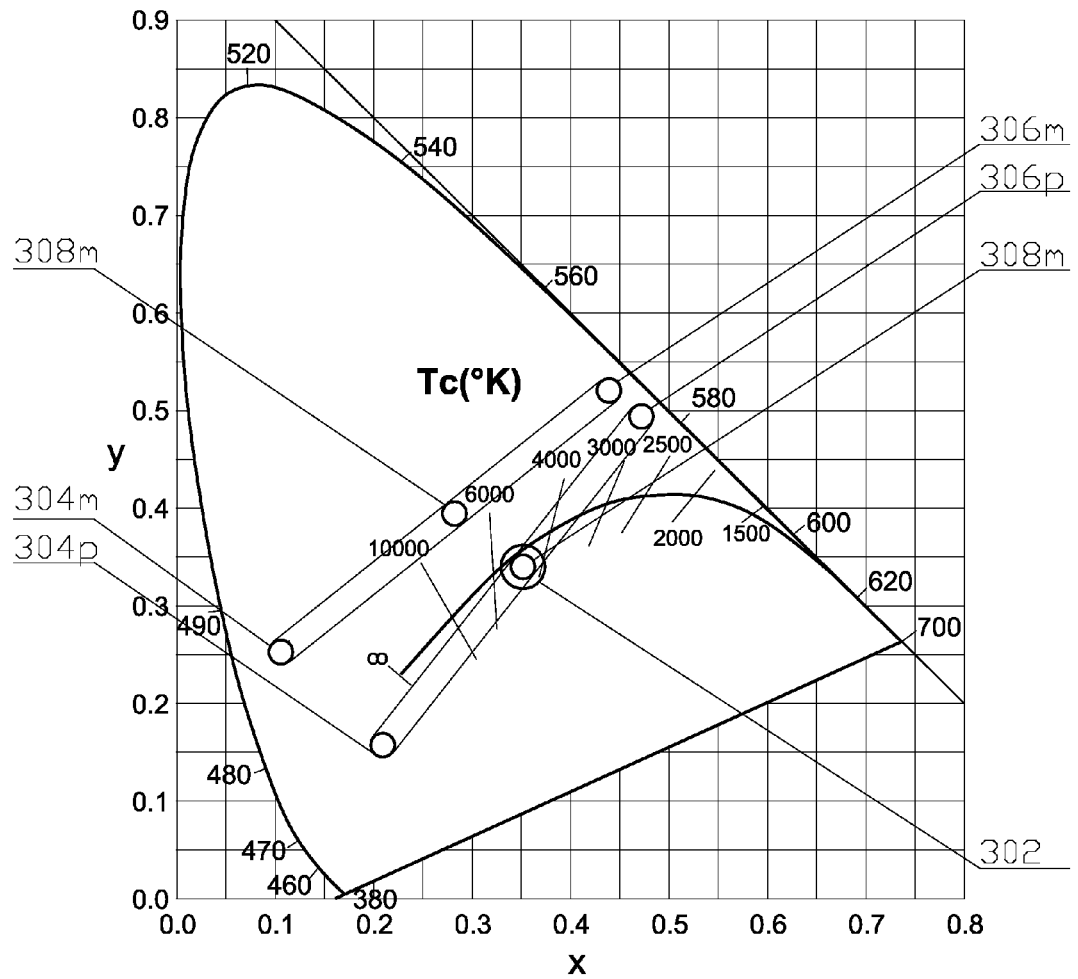
FIG. 3 depicts a concept of reproducible change in light characteristics due to the change in operating conditions in accordance with an aspect of this disclosure.

The concept of reproducible change in light characteristics due to the change in operating conditions is described in reference to FIG. 3. The desired color accuracy over a range of operating conditions pre-determined for a particular application is depicted as an area 302 in the CIE chromaticity diagram. Characteristics of at least two color-emitting sources (two sources shown) over the pre-determined range of operating conditions are depicted as areas 304(p) and 306(p), respectively. The characteristics of the two color-emitting sources are selected so that the characteristics of the color generated by mixing the colors emitted by each source, represented by an area 308(p), lies within the area 302. A person skilled in the art will appreciate that the characteristics of the two color-emitting sources as well as the color generated by mixing the colors emitted by each source are depicted as areas rather than points due to a change in the characteristics under the pre-determined range of operating conditions. A person skilled in the art will further appreciate that the shape of the areas 302-308 is depicted as circles for purposes of explanation only, and may have different shapes in practical application.

FIG. 3 further depicts characteristics of the two color-emitting sources over a different operating conditions, e.g., operating conditions used in specification sheet of the two color-emitting sources, or a range of operating conditions, e.g., a range of operating conditions to be kept at the manufacturing and/or testing process. The characteristics are depicted as areas 304(m) and 306(m), respectively.

The change in operating conditions of the two color-emitting sources, i.e., the conditions under which the light-emitting device will be operated in the particular application and the conditions to be kept at the manufacturing and/or testing process, resulted in a change in emitted color characteristics represented in change of x and y coordinates the CIE chromaticity diagram, and change in flux. The resulting change of the light generated by mixing the color emitted by each color-emitting source is represented by an area 308(m). Consequently, the light emitted by the light-emitting device is non-white when the light-emitting device operates under the conditions to be kept at the manufacturing and/or testing process, but becomes white when the light-emitting device operates under the operating conditions for the particular application.

Consequently, by determining characteristics of the light generated by mixing the color emitted by each color-emitting source as a function of operating conditions, it is possible to establish desired light characteristics of the two light sources over the second range of operating conditions given the desired color accuracy over the range of operating conditions pre-determined for the particular application. The characteristics of the generated by mixing the color emitted by each color-emitting source as a function of operating conditions may be carried out directly on the generated light, or, indirectly by determining characteristics of the two light sources and then by determining characteristics of the light in accordance with the determined characteristics of the at least two light sources. Any method for such determining may be used, e.g., measurement of the characteristics, derivation of the characteristics based on theory, of measurement and theory, and/or any other approaches known to a person skilled in the art. This concept may be utilized to great advantage in design and manufacturing of light-emitting semiconductor-based devices with controlled color accuracy as described in reference to FIG. 4.

Figure 4:
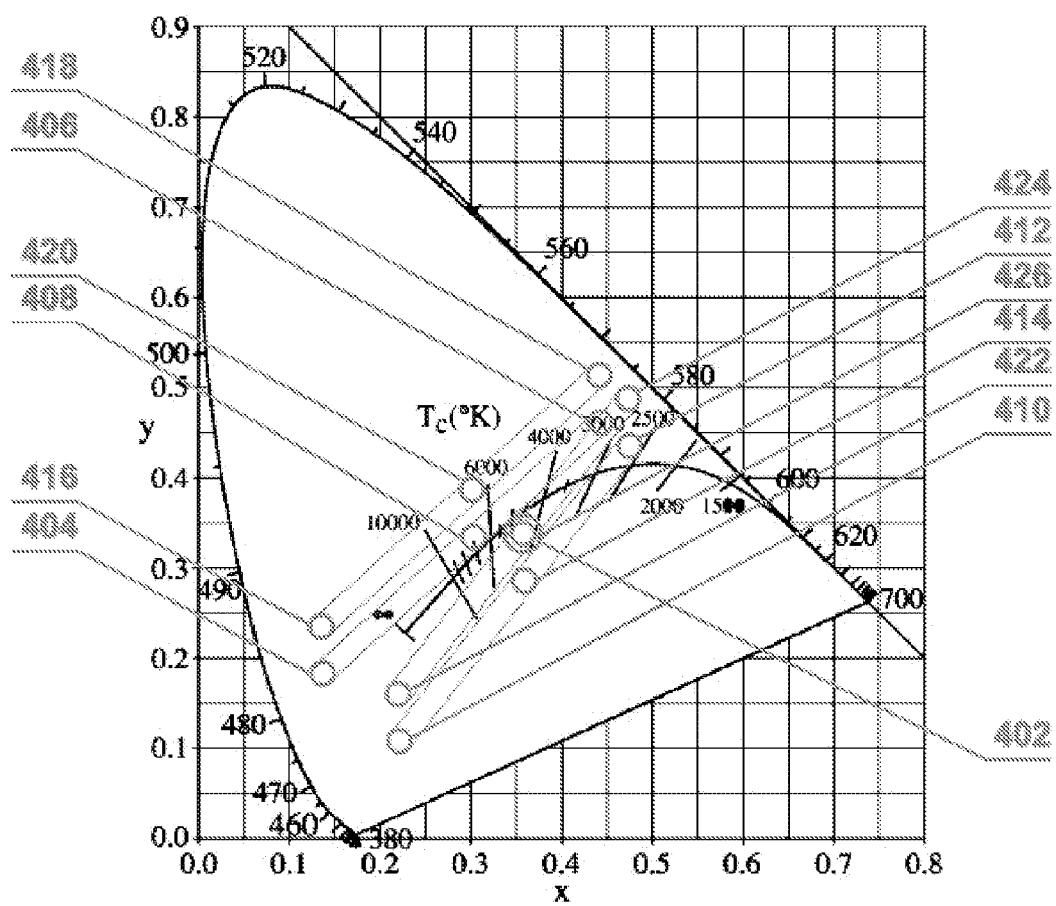
FIG. 4 depicts a concept of controlling color accuracy of a light-emitting device in accordance with an aspect of this disclosure.

The range of operating conditions and the desired color accuracy is defined in accordance with the application. The manufacturing and/or testing conditions, different form the application operating conditions are established in accordance with industry standard characterization, i.e., most LEDs are characterized utilizing pulsed current at room temperature, capabilities of the manufacturer, ease of implementation, manufacturing cost, manufacturing throughput, and other considerations known to a person skilled in the art. After selecting color-emitting sources and manufacturing sample (s) of light-emitting device(s), the sample(s) is/are then characterized by measuring the light characteristic change from manufacturing and/or test operating conditions to application operating conditions. Referring to FIG. 4, measured characteristics of the color-emitting sources at the manufacturing and/or testing conditions is depicted as areas 404 and 406, respectively; the characteristics of the color generated by mixing the colors emitted by each source, represented by area 408. Measured characteristics of the color-emitting sources at application operating conditions is depicted as areas 410 and 412, respectively; the characteristics of the color generated by mixing the colors emitted by each source, represented by area 414. As depicted in FIG. 4, the color represented by area 414 does not lie within the desired color accuracy depicted as an area 402. However, since change from manufacturing and/or test operating conditions to application operating conditions has been characterized, the design, i.e., the selection of the color-emitting sources can be adjusted to compensate for the change in the light characteristic due to the change in the operating conditions so that the light characteristics produced by the adjusted design lie within the desired color accuracy. The adjustment to the design may comprise a selection of the characteristics of the LED light source, e.g., emission wavelength, luminous flux, and the like, and/or selection of the mix and/or amount of phosphor(s). Referring to FIG. 4, such adjustment is depicted as change in characteristics of at least two color-emitting sources from color-emitting sources represented by areas 404 and 406, respectively, to color-emitting sources represented by areas 416 and 418, respectively. Because the change in light characteristics due to the change from manufacturing and/or test operating conditions to application operating conditions has been characterized, the characteristics of at least two color-emitting sources is represented by areas 422 and 424 at the application operating conditions. Consequently, the color generated by mixing the colors emitted by each source area 426 now lies within the desired color accuracy depicted as an area 402.

The above-described approach may be preferable to an alternative approach, which characterizes and tests the manufactured device at application operating conditions because significant time is spent on testing manufactured devices due to the time associated with the time necessary to establish the application operating conditions, e.g., due to thermal capacity of the LED achieving thermal stabilization at the operating temperature may be long lasting process. A potential solution would be to pre-heat the manufactured devices in large batches to the operating temperature, and then test the entire batch at the operating temperature.

Additional consideration concerns a light-emitting device, in which the at least two color sources comprise at least two LED dice together with phosphors, e.g., the above-discussed light-emitting device comprising a blue color emitting LED die (a first LED die), a red color emitting LED die (a second LED die), and phosphors. It is an industry practice that the manufacturers assign LED dice to bins in accordance with pre-determined characteristics, i.e., luminous flux, wavelength, color rendering index, and the like. Each bin is defined over a range of the pre-determined characteristics. Consequently, the above-described design must take into the consideration the range of the characteristics within the bins, as explained in reference to FIG. 5.

Figure 5:
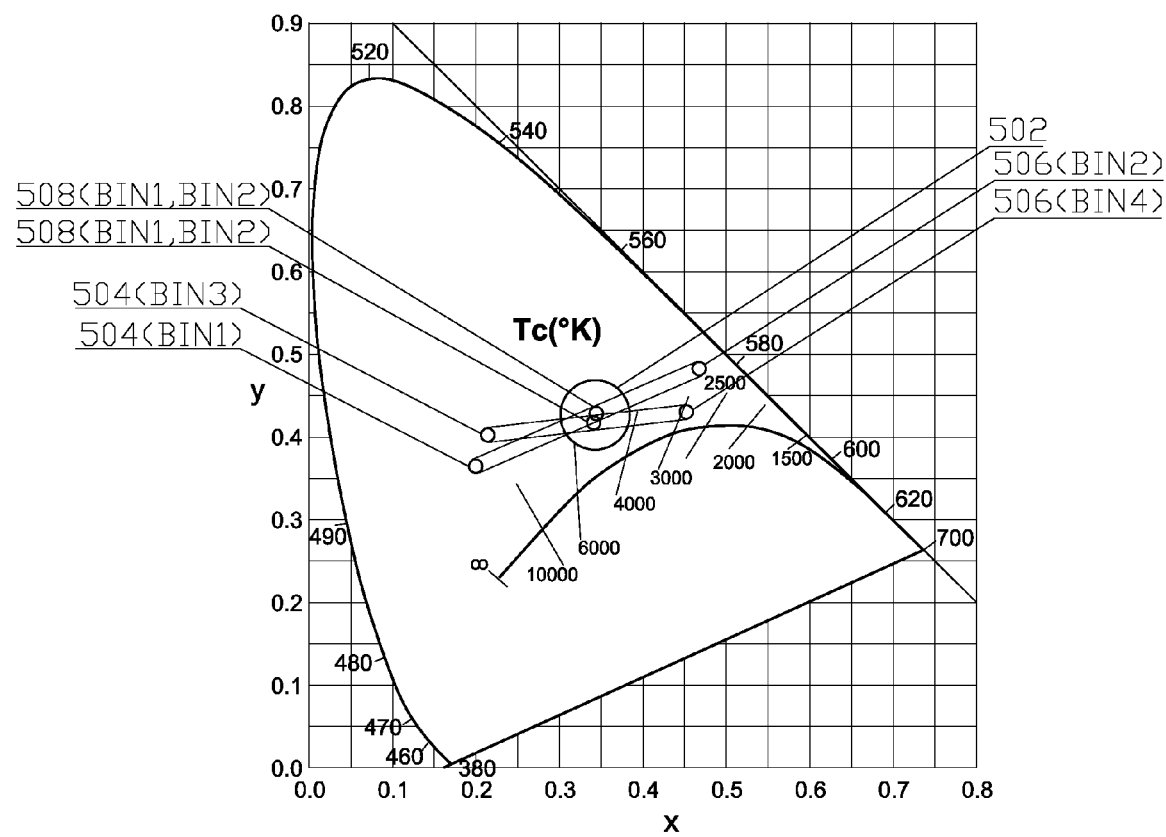
FIG. 5 depicts a concept of selecting LED dice light sources in accordance with an aspect of this disclosure.

Referring to FIG. 5, an area 502 in the CIE chromaticity diagram represents an allowed deviation of color produced by mixing colors of the two LED dice over a range of operating conditions—either manufacturing and/or test operating conditions or application operating condition. Characteristics of the two LED dice selected from the respective two bins, e.g., Bin1, Bin2 are depicted as areas 504(Bin1) and 506(Bin2). The two bins must comprise LED dice, characteristics of which assure that the characteristics of the color generated by mixing the colors emitted by each LED die represented by an area 508(Bin1,Bin2) lies within the area 502 over the range of the operating conditions. A person skilled in the art will appreciate that the shape of the areas 502-508 is depicted as circles for purposes of explanation only, and may have different shapes in a practical application.

In accordance with another aspect of the disclosure, it not necessary that the set of bins for a particular application be limited to two bins. Accordingly, several bin combination may satisfy the requirement without the need of complete re-design. Referring back to FIG. 5, area 504(Bin3) represent characteristics of the first LED die selected from a bin, e.g., Bin3. Because, as discussed above, it is mandatory that the characteristics of the color generated by mixing the colors emitted by each LED die lies within an area 502, the second LED die must be selected from a bin, e.g., Bin4, so that the shift in a position of the area 504(Bin1) to 504(Bin3) is compensated for by an appropriate shift in the position of the area 506(Bin4) relative to the position of the area 506(Bin2). Such a selection assures that the characteristics of the color generated by mixing the colors emitted by the two LED dice represented by an area 508(Bin3, Bin4) lies within the area 502. Consequently, the characteristics of the color generated by mixing the colors emitted by the two LED dices have not changed more than the allowed deviation. Therefore, by replacing LED dice selected from (Bin1, Bin2) by LED dices selected from (Bin3, Bin4); there is no need to redesign the light-emitting device, by further adjusting the phosphors color-emitting source.

Once the design process is finished, the selection of the two LED dices may proceed as follows. The allowed deviation in the desired color produced by mixing colors of the two LED dice over a range of operating conditions is determined. Because the allowed deviation must satisfy the design goal, established by defining the color accuracy of the light-emitting device, the allowed deviation is determined in accordance with the defined color accuracy. The two bins, from which the two LED dice are picked, are selected so that the change in the desired color produced by mixing colors of the two LED dice due to the range of characteristics within each bin remains within the allowed deviation over the range of operating conditions. Although in principle the approach is operating conditions agnostic, i.e., either the manufacturing and/or test operating conditions or the application operating conditions may be used, practical consideration may favor, e.g., the manufacturing and/or test operating conditions.

In another aspect of the disclosure, instead of selecting the sets of bins from a set of bins offered by a manufacturer, the required ranges of characteristics for the bins can be specified in accordance with the design process. The manufacturer can then be requested to bin the LED dices to the specification.

Although the disclosure may refer to two color-emitting sources to explain the different aspects, a person skilled in the art will appreciate be able to extend the disclosed concepts to three and more color-emitting sources, e.g., by recalling that the chromaticities of all mixtures of any two light sources lie on a straight line connecting the chromaticities of the two light sources and that varying the luminosity of each light sources, in other words, varying the ratio of the luminosities, varies a particular light defined by a position of a point on the line.

The various aspects of this disclosure are provided to enable one of ordinary skill in the art to practice the present invention. Modifications to various aspects of a presented throughout this disclosure will be readily apparent to those skilled in the art, and the concepts disclosed herein may be extended to other applications. Thus, the claims are not intended to be limited to the various aspects of the reflective surfaces for a light-emitting device presented throughout this disclosure, but are to be accorded the full scope consistent with the language of the claims. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A method for controlling color accuracy of a light-emitting semiconductor-based device, the method comprising:

defining a desired color accuracy of a light produced by mixing colors emitted by at least two light sources over a first range of operating conditions;

determining characteristics of the produced light as a function of operating conditions; and establishing desired light characteristics of the at least two light sources over a second range of operating condition in accordance with the defining and the determining.

2. The method according to claim 1, wherein the first range of operating conditions comprises a manufacturing and/or testing conditions range; and the second range of operating conditions comprises an application operating conditions range.

3. The method according to claim 1, wherein the first range of operating conditions comprises a first temperature range; and the second range of operating conditions comprises a second temperature range.

4. The method according to claim 1, wherein the determining characteristics of the produced light as a function of operating conditions comprises:

measuring characteristics of the produced light as a function of operating conditions.

5. The method according to claim 1, wherein the determining characteristics of the produced light as a function of operating conditions comprises:

measuring characteristics of the at least two light sources as a function of operating conditions; and determining characteristics of the produced light in accordance with the measured characteristics of the at least two light sources.

6. The method according to claim 1, further comprising:

pre-selecting the at least two light sources, wherein the pre-selecting is carried out before the determining characteristics of the light.

7. The method according to claim 6, further comprising:

re-selecting the at least two light sources in accordance with the establishing.

8. The method according to claim 1, wherein the desired color accuracy comprises a tolerance in the characteristics of the produced light from the desired characteristics of the light.

9. The method according to claim 8, wherein the desired color accuracy is represented as an area in a Commission International de l'Eclairage (CIE) chromaticity diagram.

10. The method according to claim 1, wherein the at least two light sources comprise: an LED die of a first material system; an LED die of a second material system; and at least one phosphors.

11. The method according to claim 10, wherein the LED die of a first material system comprises an AlInGaP die.

12. The method according to claim 10, wherein the LED die of a second material system comprises an InGaN die.

13. The method according to claim 10, further comprising:

determining allowed deviation of the color produced by mixing colors of the two LED dice over a range of operating conditions in accordance with the defined color accuracy; and selecting a pair of bins so that a change in the color produced by mixing colors of the two LED dice remains within the determined allowed deviation over the range of operating conditions.

14. The method according to claim 13, wherein a range of operating conditions comprises the first range of operating conditions.

15. The method according to claim 1, wherein the at least two light sources comprise:

an LED dice of a first material system; and at least one phosphors.

16. The method according to claim 15, wherein the LED die of a first material system comprises InGaN die.

17. The method according to claim 15, wherein the at least one phosphor comprises silicate phosphor.

18. The method according to claim 15, wherein the at least one phosphors comprises nitride phosphor.

19. The method according to claim 15, wherein one of the at least two sources comprises Europium-doped silicate phosphor.

* * * * *